(12) United States Patent
Sewell et al.

(10) Patent No.: US 9,818,903 B2
(45) Date of Patent: Nov. 14, 2017

(54) BONDS FOR SOLAR CELL METALLIZATION

(71) Applicants: Richard Hamilton Sewell, Los Altos, CA (US); Michel Arsène Olivier Nagamo Toko, Brussels (BE); Matthieu Moors, Braine-le-Château (BE); Jens Dirk Moschner, Heverlee (BE)

(72) Inventors: Richard Hamilton Sewell, Los Altos, CA (US); Michel Arsène Olivier Nagamo Toko, Brussels (BE); Matthieu Moors, Braine-le-Château (BE); Jens Dirk Moschner, Heverlee (BE)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 341 days.

(21) Appl. No.: 14/266,043

(22) Filed: Apr. 30, 2014

(65) Prior Publication Data

US 2015/0318420 A1  Nov. 5, 2015

(51) Int. Cl.
| | |
|---|---|
| *H01L 31/18* | (2006.01) |
| *H01L 31/0224* | (2006.01) |
| *B32B 37/06* | (2006.01) |
| *B32B 38/00* | (2006.01) |

(52) U.S. Cl.
CPC ............. *H01L 31/18* (2013.01); *B32B 37/06* (2013.01); *B32B 38/004* (2013.01); *H01L 31/022433* (2013.01); *H01L 31/022441* (2013.01); *B32B 2307/202* (2013.01); *B32B 2307/40* (2013.01); *B32B 2310/028* (2013.01); *B32B 2310/0418* (2013.01); *B32B 2311/12* (2013.01);

(Continued)

(58) Field of Classification Search
CPC ............... H01L 3/18; H01L 31/022441; H01L 31/022433; H01L 31/18; B32B 38/004; B32B 37/06; Y02E 10/50
See application file for complete search history.

(56) References Cited

U.S. PATENT DOCUMENTS 4,614,835 A * 9/1986 Carson ............ H01L 31/035281
  136/250
5,192,400 A * 3/1993 Parker ............... H01L 31/03529
  136/250

(Continued)

FOREIGN PATENT DOCUMENTS

| | | |
|---|---|---|
| DE | 10020412 | 11/2001 |
| WO | WO 2014/023668 | 2/2014 |

OTHER PUBLICATIONS

International Search Report and Written Opinion from PCT/US2015/027396 dated Jul. 24, 2015, 12 pgs.

(Continued)

*Primary Examiner* — William Coleman
(74) *Attorney, Agent, or Firm* — Schwabe, Williamson & Wyatt P.C.

(57) ABSTRACT

A solar cell can include a substrate and a semiconductor region disposed in or above the substrate. The solar cell can also include a conductive contact disposed on the semiconductor region with the conductive contact including a conductive foil bonded to the semiconductor region.

30 Claims, 17 Drawing Sheets

(52) U.S. Cl.
CPC ....... *B32B 2311/24* (2013.01); *B32B 2457/12* (2013.01); *Y02E 10/50* (2013.01)

(56) References Cited

U.S. PATENT DOCUMENTS

| | | | | |
|---|---|---|---|---|
| 5,667,596 | A * | 9/1997 | Tsuzuki | H01L 31/048 136/244 |
| 6,175,075 | B1 * | 1/2001 | Shiotsuka | B32B 17/04 136/244 |
| 8,066,840 | B2 * | 11/2011 | Narasimhan | B32B 38/10 136/256 |
| 8,691,620 | B2 * | 4/2014 | Lee | H01L 31/022425 257/E31.124 |
| 8,802,480 | B2 * | 8/2014 | Meissner | H01L 31/022425 136/250 |
| 8,946,547 | B2 * | 2/2015 | Moslehi | H01L 31/022441 136/251 |
| 9,209,019 | B2 * | 12/2015 | Dykaar | H01L 21/02422 |
| 2008/0173390 | A1 | 7/2008 | Narasimhan et al. | |
| 2009/0032081 | A1 | 2/2009 | Saita et al. | |
| 2010/0120191 | A1 | 5/2010 | Borden et al. | |
| 2011/0041911 | A1 | 2/2011 | Lee et al. | |
| 2012/0111392 | A1 | 5/2012 | Takanashi et al. | |
| 2012/0240995 | A1 | 9/2012 | Coakley | |
| 2013/0112233 | A1 * | 5/2013 | Coakley | H05K 1/02 136/244 |
| 2013/0164876 | A1 | 6/2013 | Sumitomo et al. | |
| 2015/0004737 | A1 * | 1/2015 | Harley | H01L 31/048 438/64 |

OTHER PUBLICATIONS

International Preliminary Report on Patentability for PCT Patent Application No. PCT/US2015/027396 dated Nov. 10, 2016, 9 pgs.
Supplementary European Search Report from European Patent Application No. EP 15 78 6330 dated Apr. 13, 2017, 8 pgs.

* cited by examiner

BONDS FOR SOLAR CELL METALLIZATION

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
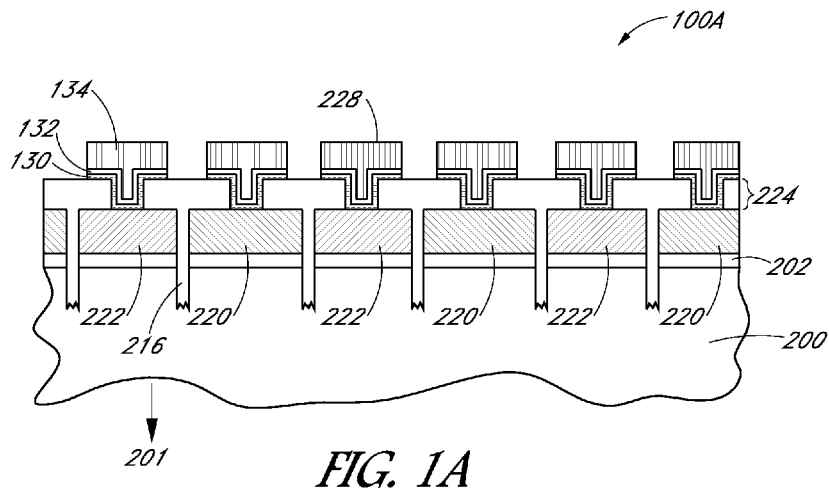
FIGS. 1A and 2A illustrate cross-sectional views of a portion of example solar cells having conductive contacts formed on emitter regions formed above a substrate, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive portion of a conductive contact does not necessarily imply that this conductive portion is the first conductive portion in a sequence; instead the term "first" is used to differentiate this conductive portion from another conductive portion (e.g., a "second" conductive portion).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although many of the examples described herein are back contact solar cells, the techniques and structures apply equally to other (e.g., front contact) solar cells as well. Moreover, although much of the disclosure is described in terms of solar cells for ease of understanding, the disclosed techniques and structures apply equally to other semiconductor structures (e.g., silicon wafers generally).

Solar cell conductive contacts and methods of forming solar cell conductive contacts are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography techniques, are not described in detail in order to not unnecessarily obscure embodiments of the present disclosure. Furthermore, it is to be understood that the various embodiments shown in the figures are illustrative representations and are not necessarily drawn to scale.

This specification first describes example solar cells that can include the disclosed conductive contacts, followed by a more detailed explanation of various embodiments of conductive contact structures. The specification then includes description of example methods for forming the disclosed conductive contacts. Various examples are provided throughout.

In a first example solar cell, a conductive foil is used to fabricate contacts, such as back-side contacts, for a solar cell having emitter regions formed above a substrate of the solar cell. For example, FIG. 1A illustrates a cross-sectional view of a portion of a solar cell having conductive contacts formed on emitter regions formed above a substrate, in accordance with an embodiment of the present disclosure.

Referring to FIG. 1A, a portion of solar cell 100A includes patterned dielectric layer 224 disposed above a plurality of n-type doped polysilicon regions 220, a plurality of p-type doped polysilicon regions 222, and on portions of substrate 200 exposed by trenches 216. Conductive contacts 228 are disposed in a plurality of contact openings disposed in dielectric layer 224 and are coupled to the plurality of n-type doped polysilicon regions 220 and to the plurality of p-type doped polysilicon regions 222.

In one embodiment, the plurality of n-type doped polysilicon regions 220 and the plurality of p-type doped polysilicon regions 222 can provide emitter regions for solar cell 100A. Thus, in an embodiment, conductive contacts 228 are disposed on the emitter regions. In an embodiment, conductive contacts 228 are back contacts for a back-contact solar cell and are situated on a surface of the solar cell opposing a light receiving surface (direction provided as 201 in FIG. 1A) of solar cell 100A. Furthermore, in one embodiment, the emitter regions are formed on a thin or tunnel dielectric layer 202.

In some embodiments, as shown in FIG. 1A, fabricating a back-contact solar cell can include forming thin dielectric layer 202 on the substrate. In one embodiment, a thin dielectric layer is composed of silicon dioxide and has a thickness approximately in the range of 5-50 Angstroms. In one embodiment, thin dielectric layer performs as a tunnel oxide layer. In an embodiment, the substrate is a bulk monocrystalline silicon substrate, such as an n-type doped monocrystalline silicon substrate. However, in another embodiment, the substrate includes a polycrystalline silicon layer disposed on a global solar cell substrate.

Trenches 216 can be formed between n-type doped polysilicon (or amorphous silicon) regions 220 and p-type doped polysilicon regions 222. Portions of trenches 216 can be texturized to have textured features. Dielectric layer 224 can be formed above the plurality of n-type doped polysilicon regions 220, the plurality of p-type doped polysilicon regions 222, and the portions of substrate 200 exposed by trenches 216. In one embodiment, a lower surface of dielectric layer 224 can be formed conformal with the plurality of n-type doped polysilicon regions 220, the plurality of p-type doped polysilicon regions 222, and the exposed portions of substrate 200, while an upper surface of dielectric layer 224 is substantially flat. In a specific embodiment, the dielectric layer 224 is an anti-reflective coating (ARC) layer.

A plurality of contact openings can be formed in dielectric layer 224. The plurality of contact openings can provide exposure to the plurality of n-type doped polysilicon regions 220 and to the plurality of p-type doped polysilicon regions 222. In one embodiment, the plurality of contact openings is formed by laser ablation. In one embodiment, the contact openings to the n-type doped polysilicon regions 220 have substantially the same height as the contact openings to the p-type doped polysilicon regions 222.

Forming contacts for the back-contact solar cell can include forming conductive contacts 228 in the plurality of contact openings 226 and coupled to the plurality of n-type doped polysilicon regions 220 and to the plurality of p-type doped polysilicon regions 222. Thus, in an embodiment, conductive contacts 228 are formed on or above a surface of a bulk N-type silicon substrate 200 opposing a light receiving surface 201 of the bulk N-type silicon substrate 200. In a specific embodiment, the conductive contacts are formed on regions (222/220) above the surface of the substrate 200.

Still referring to FIG. 1A, conductive contacts 228 can include a conductive foil 134. In various embodiments, conductive foil can include aluminum, copper, other conductive materials, and/or a combination thereof. In some embodiments, as shown in FIG. 1A, conductive contacts 228 can also include one or more conductive (metal or otherwise) regions, such as regions 130 and 132 in FIG. 1A, between conductive foil 134 and a respective semiconductor region. For example, a first conductive region 130 can include (e.g., aluminum, aluminum/silicon alloy, etc.), which can be printed, or blanket deposited (e.g., sputtered, evaporated, etc.). In one embodiment, a second conductive region can be a bonding region to promote improved bonding between the metal regions, conductive foil, and semiconductor region. Example bonding regions can include silicon (Si), nickel (Ni), germanium (Ge), lanthanide materials, alloys of aluminum and Si, Ni, Ge, or lanthanide materials, etc. In various embodiments, the second conductive region can be deposited on the first conductive region or to the foil before the cell and foil are brought into contact.

In one embodiment, as described herein, an intermetallic phase/zone/region can be formed from at least a portion of the second metal region 132 and conductive foil 134, which can allow for a lower temperature and/or less pressure during thermocompression.

Figure 1B:
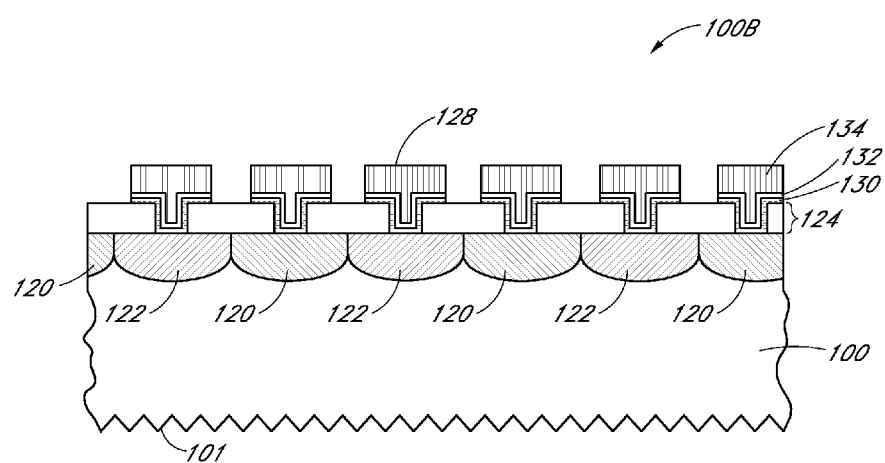
FIGS. 1B and 2B illustrate cross-sectional views of a portion of example solar cells having conductive contacts formed on emitter regions formed in a substrate, according to some embodiments.

In one embodiment, the conductive foil 134 and the one or more conductive regions 130 and 132 can be thermally compressed to the semiconductor region of the solar cell and therefore in electrical contact with the emitter regions of the solar cell 100A. As described herein, in some embodiments, as shown in FIGS. 1A and 1B, one or more conductive regions (e.g., sputtered, evaporated, or printed aluminum, nickel, copper, etc.) may exist between the thermally compressed conductive foil and the emitter regions. Thermally compressed conductive foil is used herein to refer to the a conductive foil that has been heated at a temperature at which plastic deformation can occur and to which mechanically pressure has been applied with sufficient force such that the foil can more readily adhere to the emitter regions and/or conductive regions.

In some embodiments, the conductive foil 134 can be aluminum (Al) foil, whether as pure Al or as an alloy (e.g., Al/Silicon (Al/Si) alloy foil). In one embodiment, the conductive foil 134 can also include non-Al metal. Such non-Al metal can be used in combination with or instead of Al particles. For example, in one embodiment, conductive foil 134 is a copper coated aluminum foil, which can improve solderability and/or which can help enable a subsequent plating process. Although much of the disclosure describes metal foil and metal conductive regions, note that in some embodiments, non-metal conductive foil (e.g., conductive carbon) and non-metal conductive regions can similarly be used in addition to or instead of metal foil and metal conductive regions. As described herein, metal foil can include Al, Al—Si alloy, tin, copper, and/or silver, among other examples. In some embodiments, conductive foil can be less than 5 microns thick (e.g., less than 1 micron), while in other embodiments, the foil can be other thicknesses (e.g., 15 microns, 25 microns, 37 microns, etc.) In some embodiments, the type of foil (e.g., aluminum, copper, tin, etc.) can influence the thickness of foil needed to achieve sufficient current transport across the solar cell. Moreover, in embodiments having one or more additional conductive regions 130 and 132, the foil can be thinner than in embodiments not having those additional conductive regions.

In various embodiments, the conductive foil 134 may have one or more strain relief features that can help reduce the risk and amount of bowing of the wafer. Additional details regarding the strain relief features are described herein.

In various embodiments, conductive regions 130 and 132 can be formed from a metal paste (e.g., a paste that includes the metal particles as well as a binder such that the paste is printable), from a metal powder (e.g., metal particles without a binder, a powder of Al particles, a layer of Al particles and a layer of Cu particles), or from a combination of metal paste and metal powder. In one embodiment using metal paste, paste may be applied by printing (e.g., screen printing, ink-jet printing, etc.) paste on the substrate. The paste may include a solvent for ease of delivery of the paste and may also include other elements, such as binders or glass frit.

In various embodiments, the metal particles of conductive regions 130 and 132 can have a thickness of approximately 1-500 microns. For example, for an embodiment in which the metal particles are printed, the printed metal particles can have a thickness of approximately 1-10 microns.

In various embodiments, the metal particles can be fired (before and/or after the conductive foil and conductive regions are thermally compressed), also referred to as sintering, to coalesce the metal particles together, which can enhance conductivity and reduce line resistance thereby improving the performance of the solar cell. Note that some amount of coalescing of the particles can also occur during thermal compression. As described herein, the disclosed structures and techniques can improve the electrical properties of the conductive contact of a solar cell and/or reduce cost.

Although much of the description describes using thermocompression techniques and structures (including conductive foil) instead of plated metal, in some embodiments, additional metal can be plated to conductive foil 130. For example, nickel and/or copper can be plated according to an electroless or electrolytic plating technique. Note that in one embodiment, zinc may be added, for example in a Zincate process, to enable plating on aluminum. Various examples of embodiments that can help facilitate plating are described herein.

Turning now to FIG. 1B, a cross-sectional view of a portion of an example solar cell having conductive contacts formed on emitter regions formed in a substrate is illustrated, according to one embodiment. For example, in this second exemplary cell, thermally compressed conductive foil can be used to fabricate contacts, such as back-side contacts, for a solar cell having emitter regions formed in a substrate of the solar cell.

As shown in FIG. 1B, a portion of solar cell 100B includes patterned dielectric layer 124 disposed above a plurality of n-type doped diffusion regions 120, a plurality of p-type doped diffusion regions 122, and on portions of substrate 100, such as a bulk crystalline silicon substrate. Conductive contacts 128 are disposed in a plurality of contact openings disposed in dielectric layer 124 and are coupled to the plurality of n-type doped diffusion regions 120 and to the plurality of p-type doped diffusion regions 122. In an embodiment, diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for solar cell 100B. Thus, in an embodiment, conductive contacts 128 are disposed on the emitter regions. In an embodiment, conductive contacts 128 are back contacts for a back-contact solar cell and are situated on a surface of the solar cell opposing a light receiving surface, such as opposing a texturized light receiving surface 101, as depicted in FIG. 1B.

In one embodiment, referring again to FIG. 1B and similar to that of FIG. 1A, conductive contacts 128 can include a conductive foil 134 and in some embodiments, one or more additional conductive regions, such as conductive regions 130 and 132. The conductive foil 134, and the one or more conductive regions can be thermally compressed to the semiconductor region of the solar cell and/or to one or more conductive regions between the foil and the semiconductor region and therefore in electrical contact with the emitter regions of the solar cell 100A. The conductive contact description of FIG. 1A applies equally to the conductive contact of FIG. 1B but is not repeated for clarity of description.

Figure 2A:
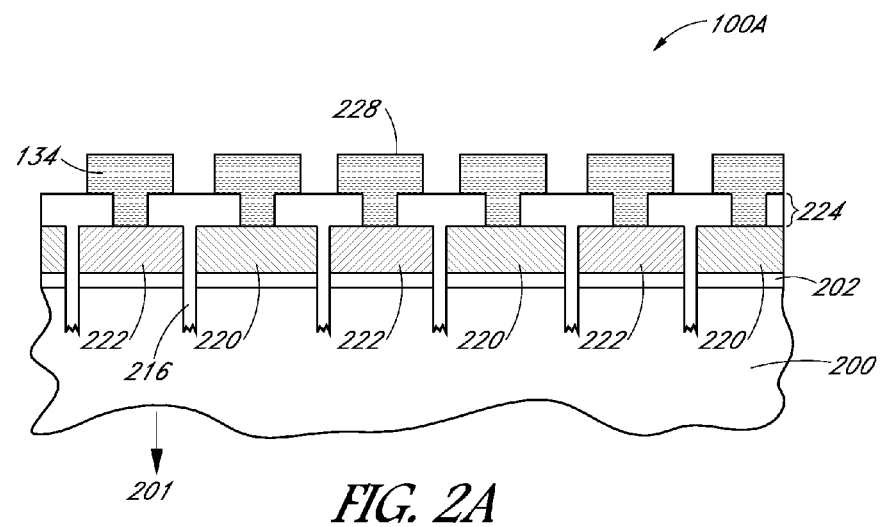

Turning now to FIG. 2A, the illustrated solar cell includes the same features as the solar cell of FIG. 1A except that the example solar cell of FIG. 2A does not include the one or more additional conductive regions (regions 130 and 132 of FIG. 1A). Instead, conductive foil 134 is thermally compressed and bonded directly to the semiconductor region of the solar cell.

Figure 2B:
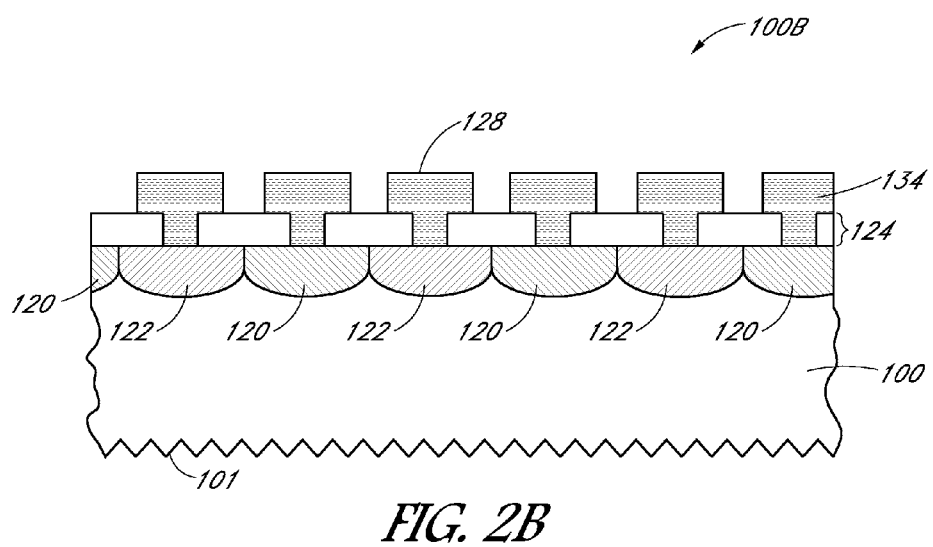

Similarly, the illustrated solar cell of FIG. 2B includes the same features as the solar cell of FIG. 1B except that the example solar cell of FIG. 2B does not include the one or more additional conductive regions (regions 130 and 132 of FIG. 1B). Instead, conductive foil 134 is thermally compressed directly to the semiconductor region of the solar cell.

Although certain materials are described herein, some materials may be readily substituted with others with other such embodiments remaining within the spirit and scope of embodiments of the present disclosure. For example, in an embodiment, a different material substrate, such as a group III-V material substrate, can be used instead of a silicon substrate.

Note that, in various embodiments, the formed contacts need not be formed directly on a bulk substrate, as was described in FIGS. 1B and 2B. For example, in one embodiment, conductive contacts such as those described above are formed on semiconducting regions formed above (e.g., on a back side of) as bulk substrate, as was described for FIGS. 1A and 2A.

Using thermally compressed particles as a contact can reduce contact resistance and improve conductivity of the conductive contact and as a result, improve the performance of the solar cell. Furthermore, the deformed particles can increase the cohesion of the particles and adhesion of the particles to the solar cell. Moreover, in an embodiment in which Al particles are used (whether in a first or second conductive region or as part of the conductive foil), deforming the Al particles can break the oxide shell around the Al particles further enhancing the deformed Al particles' conductivity. When particles are deformed, the particle to particle contact area increases, thus aiding interdiffusion of atoms during sintering, which ultimately can improve the conductivity and cohesion of the particles.

Figure 3:
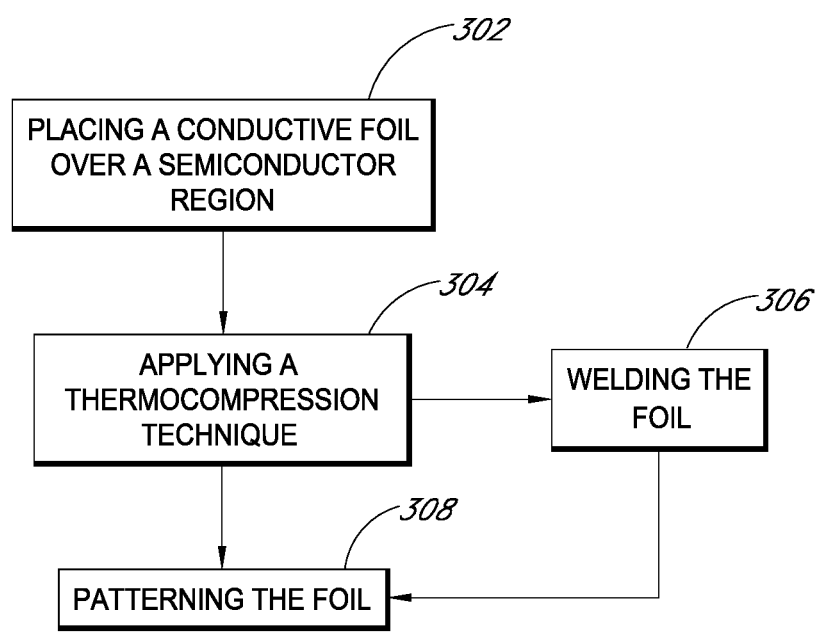
FIG. 3 is a flowchart illustrating an example method of forming a conductive contact, according to one embodiment.

Turning now to FIG. 3, a flow chart illustrating a method for forming a conductive contact is shown, according to some embodiments. In various embodiments, the method of FIG. 3 may include additional (or fewer) blocks than illustrated. For example, in some embodiments, welding the foil, as shown at block 306, may not be performed.

Figure 4A:
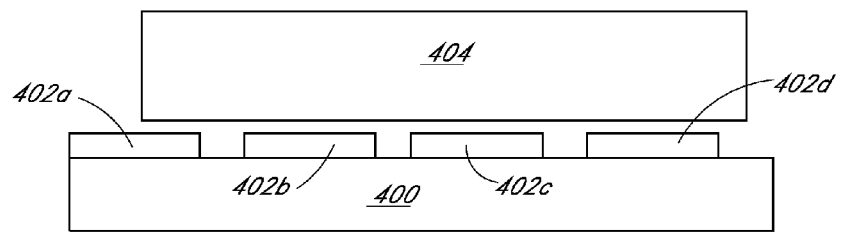
FIGS. 4A and 4B illustrate cross-sectional views of forming a conductive contact in an embodiment with a sputtered first metal region.

As shown at 302, a conductive foil can be placed over a semiconductor region. As described herein, the conductive foil can be aluminum foil, copper foil, copper-coated aluminum foil, among other examples. Although described as foil, note that the foil does not necessarily have to have the shape of a sheet, but can be pre-patterned in the shape of wires, ribbons, fingers, etc. FIG. 4A illustrates an example cross-sectional view conductive foil 404 being placed over wafer 400. Note that in some embodiments, conductive foil 404 can overlap wafer 400 completely, in contrast to the illustration of FIG. 4A. Further note that for ease of illustration, the actual semiconductor regions are not illustrated in FIG. 4A but the semiconductor regions of FIG. 2A or 2B apply equally to the illustration of FIG. 4A. As shown in FIG. 4A, conductive foil 404 can be positioned over dielectric regions 402a, 402b, 402c, and 402d.

In one embodiment, the conductive foil can be vacuumed or otherwise held tightly to the surface of the wafer to help ensure a proper fit up of the foil to the wafer. For example, the surface upon which the wafer sits (e.g., plate 410 in FIG. 4B) can include a number of holes through which air is removed from the foil/wafer interface.

At 304, a thermocompression technique can be applied to the conductive foil. The thermocompression technique can include heating and applying mechanical force to the foil. Heating the foil can reduce the amount of mechanical force needed by reducing the yield strength of the foil and help improve the bond. In some embodiments, heating the conductive foil can include heating the foil at temperatures above 200 degrees Celsius and applying mechanical force can include applying pressure of at least 1 psi.

In one embodiment, mechanical force can include vertical compression and/or lateral mechanical force. Mechanical force can be applied by a tool 412, such as a roller, plate, squeegee, among other tools. Tools can be made from graphite, have a graphite coating, or be made from or have a coating from another material such as Marinite A or Marinite C or other such that the tool will not adhere to the foil during thermocompression. As one example of a tool, in one embodiment, the conductive foil can be pressed between two substantially parallel plates that are subjected to pressure to force the wafer and foil together. In another embodiment, the foil and wafer can be pressed together using flexible membranes with pressurized fluid on the other side of the membrane. The pressurized fluid pressing can be dry-bag or wet-bag isostatic pressing, which can be cold or hot isostatic pressing.

Figure 4B:
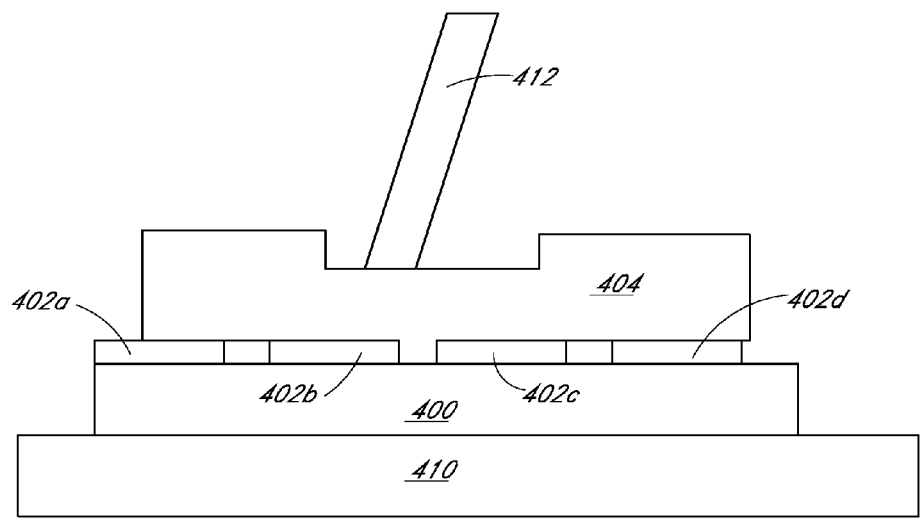

In various embodiments, the heating and mechanical force can be applied together or the heating can occur first, followed by application of mechanical force. For example, in one embodiment, wafer 400 can be placed on a hot surface 410, such as a hotplate set at approximately 400-500 degrees Celsius as shown in FIG. 4B. In one embodiment, tool 412 can be heated, in addition to or instead of heating the surface on which the wafer is positioned. Note that approximately 400-500 degrees is an example used for an aluminum-based foil in the range of 20-40 microns but other examples exist. For example, for a foil of a different type and thickness, a different temperature and time sufficient to soften the foil can be used. Moreover, as described herein, by using a second conductive region from which an intermetallic phase can be formed, a lower temperature and less force can be used for thermocompression.

In one embodiment, in addition to or instead of forming a thermocompression bond, ultrasonic agitation of the foil-seed interface can be used, which can result in a stronger bond or reduce the processing temperature required for bonding.

In one embodiment, the temperature used to heat the conductive foil and/or conductive region(s) can be similar to a temperature used in a formed gas anneal ("FGA") process for fabrication of a solar cell. Accordingly, in one embodiment, heating the foil and/or applying mechanical force can be performed during the FGA process in the same tool, which can result in fewer pieces of fabrication equipment and save time during the manufacturing process.

In some embodiments, the tool, plate(s), and/or surface can be made of a material that is less likely to form a bond with the conductive foil or wafer. For example, in an embodiment in which the conductive foil includes aluminum, the tool may include graphite to make the tool itself less likely to stick or bond to the foil.

In some embodiments, the conductive foil can expand more than the wafer such that, upon cooling, the wafer/foil assembly can bow as the foil contracts more than the wafer. To help alleviate wafer bowing, one or more strain relief features can be added to the foil. For example, in one embodiment, the mechanical force can be selectively applied (e.g., unevenly distributed). Selective force can be applied with a patterned tool, which in some embodiments can be a patterned platen or pattered die. By patterning the pressure field applied to the foil, regions of the foil can be alternately strongly and weakly bonded. Weakly bonded areas can then be more easily removed from the cell by etching, laser ablation, tearing, a combination of etching, ablation, and/or tearing, etc.

In some embodiments, the foil can be bonded to the wafer at discrete points or lines (strongly bonded) with the foil bending away from the plane of the wafer at other points (weakly bonded). The weakly bonded foil regions can delaminate from the wafer allowing for plastic deformation (contracting) of those regions, which can relieve strain from the system and reduce wafer bowing. Various examples of the strain relief features and patterned die can be seen at FIGS. 9, 10, 11A-11C, and 12A-C. As one specific example, as shown in FIGS. 11A-11C, force can be applied in a pattern that approximates the finger pattern of the solar cell, which can not only create strain relief features but can also concentrate the mechanical force in the regions corresponding to the contacts such that the overall mechanical force applied to the cell as a whole can be lessened. Other strain relief features can include perforations or slits in the foil, among other examples.

In some embodiments, additional conductive material can be added on top of the conductive foil. For example, an additional conductive foil can be added either before or after the heating and mechanical force is applied. As one specific example, a region of copper (e.g., a copper paste, foil, or powder) can be added on the conductive foil and thermally compressed together with the conductive foil and substrate such that the outermost portion of the contact is copper, which can make soldering more effective, for example, to interconnect multiple solar cells. In another embodiment, the additional conductive material can include plated metal, such as copper.

At 306, the conductive foil can be welded in some embodiments. In other embodiments, the welding at block 306 may not be performed. In one embodiment, the conductive foil can be welded to the semiconductor regions of the solar cell without performing the thermocompression technique at block 304. In another embodiment, the conductive foil can be welded to the semiconductor regions after performing block 304. Welding can be laser welding, friction welding, or other types of welding and can be applied as spot welding (e.g., in locations corresponding to fingers) and can increase the strength of the bonds.

As shown at 308, the conductive foil can be patterned. Numerous patterning examples exist and are described in more detail below. For example, the patterning at 308 can include mask and etch patterning, groove and etch patterning, mask, groove, and etch patterning, among other examples. In an embodiment in which a thermocompression bond is substantially continuous over a large area of the wafer, wet etching can be used as a method of patterning with a reduced risk of trapping etch chemistry in the structure.

Figure 5:
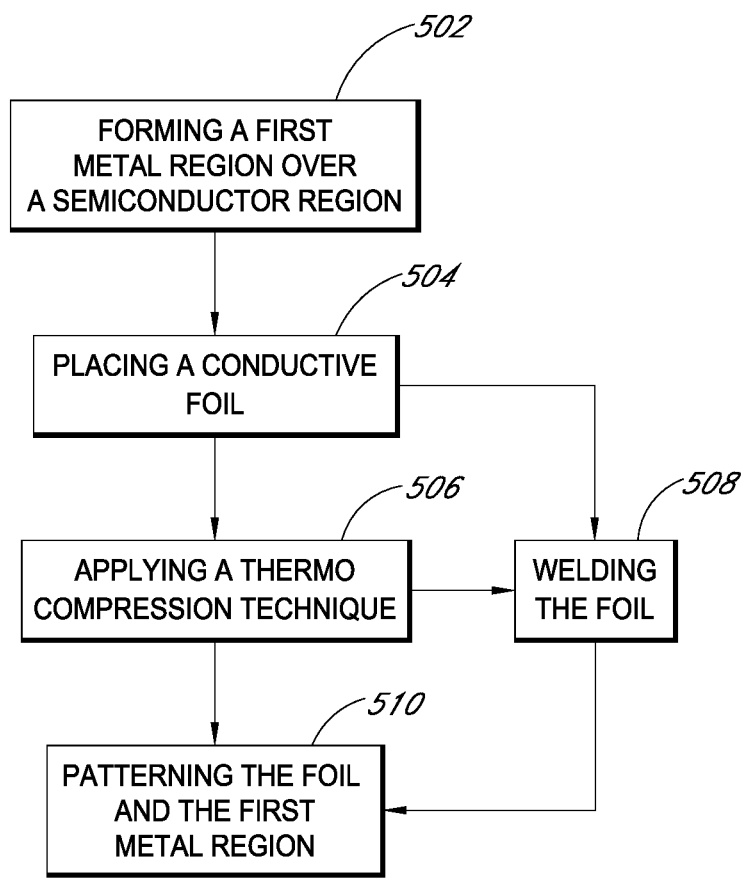
FIG. 5 is a flowchart illustrating an example method of forming a conductive contact, according to one embodiment.

Turning now to FIG. 5, a flow chart illustrating a method for forming a conductive contact is shown, according to some embodiments. In various embodiments, the method of FIG. 5 may include additional (or fewer) blocks than illustrated. For example, in some embodiments, welding the foil, as shown at block 508, may not be performed. Or, in some embodiments, applying the thermocompression technique at 506 may not be performed. Moreover, in various embodiments, the description of the method of FIG. 3 applies equally to the description of the method of FIG. 5. Accordingly, for clarity of explanation, some description of that description is not repeated.

As shown at 502, a first metal region (or non-metal conductive region) can be formed over a semiconductor region. In one embodiment, the first metal region can be a paste, particles, or a thin continuous layer, etc., and can be formed in a variety of manners, such as sputtering, printing metal (e.g., printed in a pattern, such as a finger pattern), evaporating, otherwise depositing, etc. The first metal region can include metal, solvents, binders, viscosity modifiers, etc. Metal examples include aluminum, aluminum-silicon, other aluminum alloys, among other examples.

In various embodiments, the thickness of the first metal region can be less than 5 microns, and in one embodiment, can be less than 1 micron.

In one embodiment, one or more additional regions can be formed over the first metal region (e.g., by sputtering, printing, evaporating, etc.). In one embodiment, the additional region(s) (e.g., a second metal or non-metal conductive region) can include a bonding region that can form an intermetallic phase or alloy with the conductive foil. Examples of such a bonding region include nickel, germanium, silicon, lanthanide metals, or an alloy of at least aluminum with one of those materials. In one embodiment, the bonding region can form the intermetallic phase at a temperature below the melting point of the conductive foil (e.g., for an embodiment in which the conductive foil is an aluminum foil, below the melting point of aluminum). By forming the intermetallic phase or alloy, a sufficient bond can be formed between the foil, intermetallic phase, first metal region, and substrate even with a lower thermocompression temperature and/or less pressure. Accordingly by using less pressure and a lower temperature, the risk of damage to the wafer can be reduced. Moreover, the intermetallic phase can enable bypassing the thermocompression technique altogether and provide for a sufficient bond by another technique, such as welding. Accordingly, in one embodiment, the foil and second metal region can be welded and, in doing so, form an intermetallic phase.

In one embodiment, the first and second metal regions can be formed with the same tool (e.g., PVD, tool, CVD tool, etc.) and therefore adds minimal processing time and cost to the manufacturing process.

In an embodiment in which the additional metal region(s) is a printed seed, the first metal region can be fired to volatize solvents and any viscosity modifier as well as to activate any binders. After firing, the particles of the paste can be bonded to each other and to the substrate. Firing can be performed before or after thermocompression.

As shown at 504, a conductive foil can be placed over the first metal region, and in embodiments in which additional metal region(s) are over the first metal region, over the additional metal region(s). As described herein, the conductive foil can be aluminum foil, copper foil, copper-coated aluminum foil, among other examples. Moreover, as described herein, multiple layers of conductive foil can be used (e.g., a layer of aluminum foil, and layer of copper foil, etc.).

In one embodiment, a thermocompression technique can be applied to the conductive foil as shown at 506, and as described at block 304 of FIG. 3.

At 508, in one embodiment, the conductive foil can be welded as described at block 306 of FIG. 3.

As shown at 510, the foil and any metal regions (e.g., first, second, etc.) can be patterned as described at block 308 of FIG. 3 and as described herein.

Figure 6A:
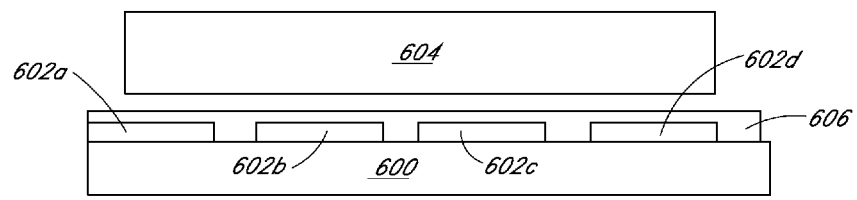
FIGS. 6A and 6B illustrate cross-sectional views of forming a conductive contact in an embodiment with a sputtered first metal region.
Figure 6B:
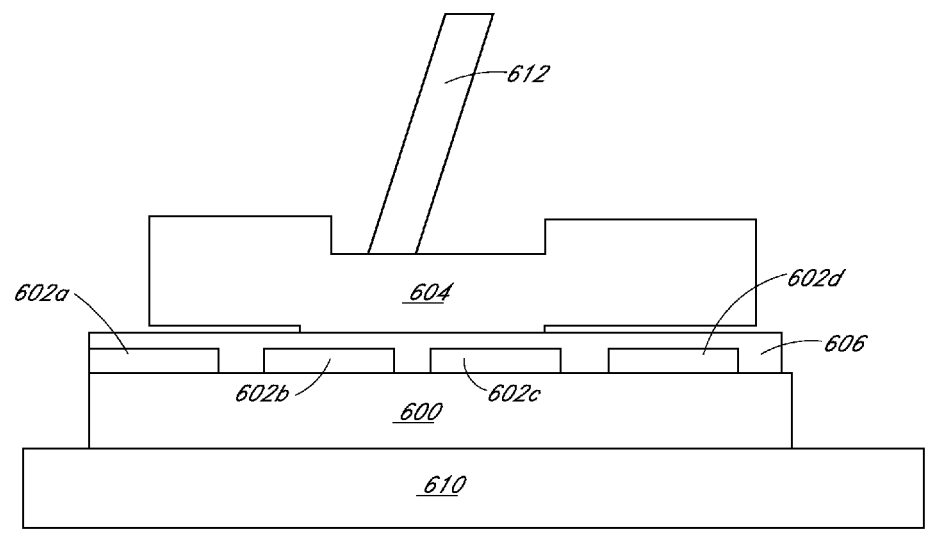

FIGS. 6A and 6B illustrate cross-sectional views of forming a conductive contact in an embodiment with a sputtered first metal region. As shown in FIG. 6A, conductive foil 604 is placed over first metal region 606, which is formed over wafer 600. As shown, first metal region is sputtered such that at least a portion of it is between dielectric regions 602*a-d* and at least a portion of it is on those dielectric regions. Note that in some embodiments, conductive foil 604 can overlap wafer 600 completely. Further note that for ease of illustration, the actual semiconductor regions are not illustrated in FIG. 6A but the semiconductor regions of FIG. 1A or 1B apply equally to the illustration of FIG. 6A.

As shown in FIG. 6B, wafer 600 is placed on a hot surface, such as hotplate 610 set at approximately 400-500 degrees Celsius. Pressure is then applied by tool 612 to apply the compression portion of the thermocompression technique. Other example thermocompression techniques exist as well, as described herein. For example, tool 612 may apply both the heat and pressure instead of, or in addition to, the hotplate applying heat.

Figure 7A:
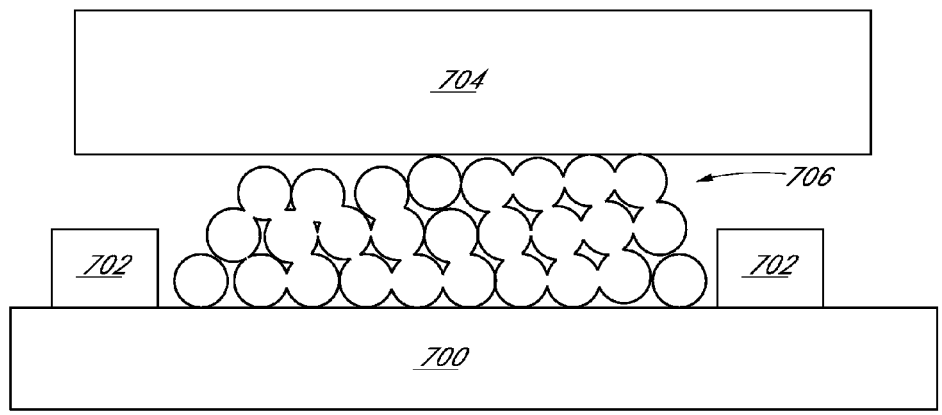
FIGS. 7A and 7B illustrate cross-sectional views of forming a conductive contact in an embodiment with a printed first metal region.
Figure 7B:
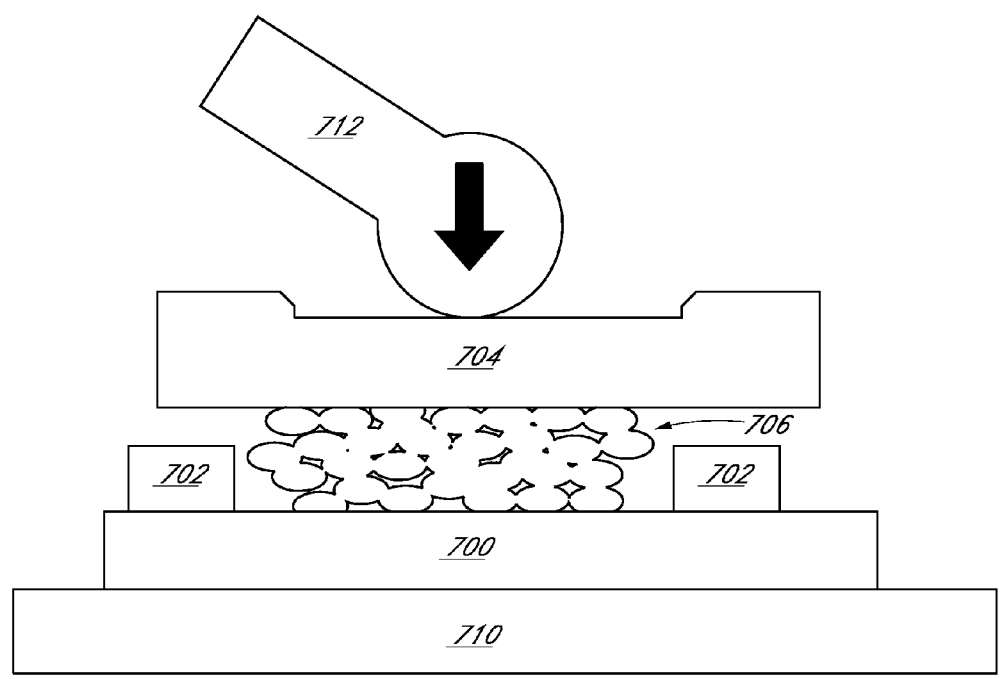

FIGS. 7A and 7B illustrate cross-sectional views of forming a conductive contact in an embodiment with a printed seed first metal region. In contrast to FIG. 6A, the first metal region 706 in FIG. 7A is a printed seed region that does not cover the entire surface of wafer 700. For example, the pattern in which the seed region is printed can be in a finger pattern so that the first metal region 706 does not necessarily need to be patterned. Although the dielectric regions of FIGS. 6A and 6B are not illustrated in FIG. 7A for clarity, those regions may nevertheless be present in the example of FIG. 7A as well. Note that in FIGS. 7A and 7B, the particles of the first metal region 706 have been specifically illustrated but the skilled person will understand that the structure of the first metal region 706 is similar to the structure of the other metal regions described herein.

FIG. 7B illustrates applying thermocompression to the first metal region 706 and conductive foil 704. As shown, the particles of the first metal region 706 can be deformed, which can cause the particles to adhere to one another and to the substrate better and decrease line resistance, thereby enhancing conductivity and solar cell performance. As is the case with the example of FIGS. 6A-6B and 7A-7B, other examples to heat and apply pressure exist. For example, instead of or in addition to using a hot plate 710, the tool 712 can be heated. Or, the tool and assembly can be placed in an oven (e.g., as part of an FGA process or otherwise).

Figure 8:
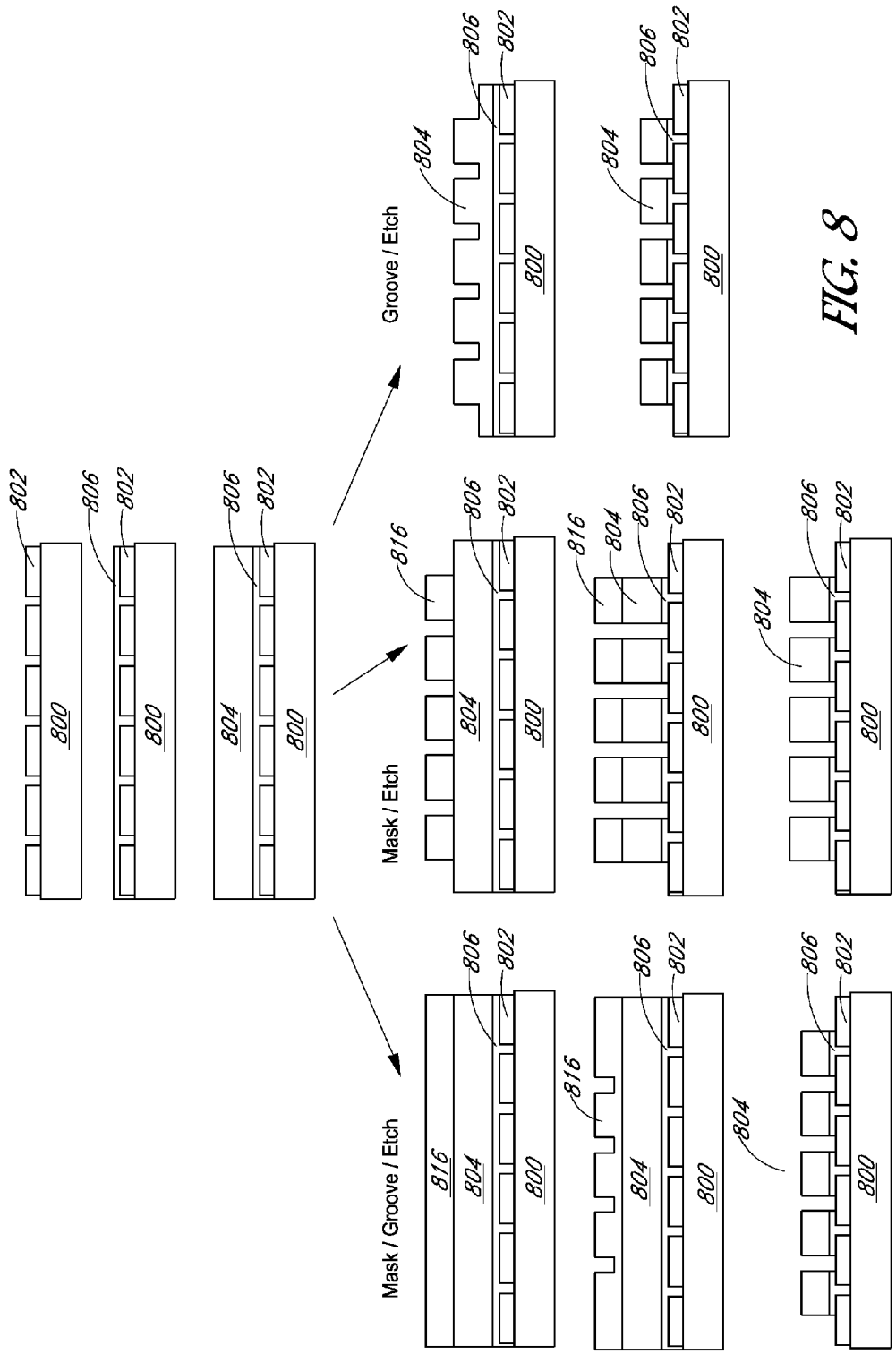
FIG. 8 illustrates cross-sectional views of various example patterning sequences for patterning the foil (and in some instances metal region(s)) to form a conductive contact.

FIG. 8 illustrates cross-sectional views of various example patterning sequences for patterning the foil (and in some instances metal region(s)) to form a conductive contact. Although FIG. 8 illustrates three patterning sequences, others can exist. The first three views can apply to all three sequences. As shown, a first metal region 806 is formed over wafer 800 and a conductive foil is placed over the first metal region 806. As described herein, note that the first metal region 806 may not be present in some embodiments (e.g., as shown in FIGS. 2A, 2B, and 3). And note that in some embodiments, one or more additional metal regions can be present. Similar patterning techniques can apply regardless of whether a metal region or regions is present between the conductive foil and semiconductor region.

The leftmost patterning sequence illustrates a mask, groove, and etch sequence. As shown, a non-patterned mask 816 (e.g., non-patterned etch resist, film, etc.) is applied on conductive foil 804, for example, across substantially the entire surface of the conductive foil. Mask 816 is then patterned as shown in the next view in the sequence, whether by laser ablation, mechanical grooving, or otherwise. In one embodiment, the conductive foil can also be patterned or grooved, for example by laser ablation. Next, a chemical etch is applied and the mask is stripped with the resulting cell with conductive contacts illustrated in the final sequence.

The middle patterning sequence is similar to the mask, groove, and etch sequence except that mask 816 is applied (e.g., printed) in a particular pattern instead of as a blanket mask. As shown, a chemical etch is applied and then mask 816 is stripped with the resulting cell with conductive contacts illustrated in the final view of the sequence.

The rightmost sequence illustrates a groove and etch patterning techniques which does not include applying a mask (blanket, patterned, or otherwise). As shown, the actual conductive foil 804 can be grooved in locations corresponding to the dielectric regions 802 (and where separation between fingers is intended). In one embodiment, laser grooving those locations can remove a majority of the thickness in those locations. Accordingly, the groove does not entirely cut through the entire foil, instead leaving a portion. A chemical etch is then applied which removes the remaining portion from the groove thereby separating the foil (and any metal regions between the foil and semiconductor region) into the pattern.

Similar to the groove and etch example, in one embodiment, the conductive foil 804 can include an etch-resistant coating on its outer surface. The etch-resistant coating can be patterned with a laser or otherwise, followed by one or more chemical etches.

The disclosed thermocompression structures can offer many advantages when considering the various patterning techniques. For example, because the conductive foil (and if applicable, conductive region(s)) is compressed substantially uniformly across the solar cell, wet etching can be used with a reduced risk of trapping etch chemistry in the solar cell as opposed to techniques in which the foil or metal regions leave gaps in which the etch chemistry could be trapped.

Figure 9:
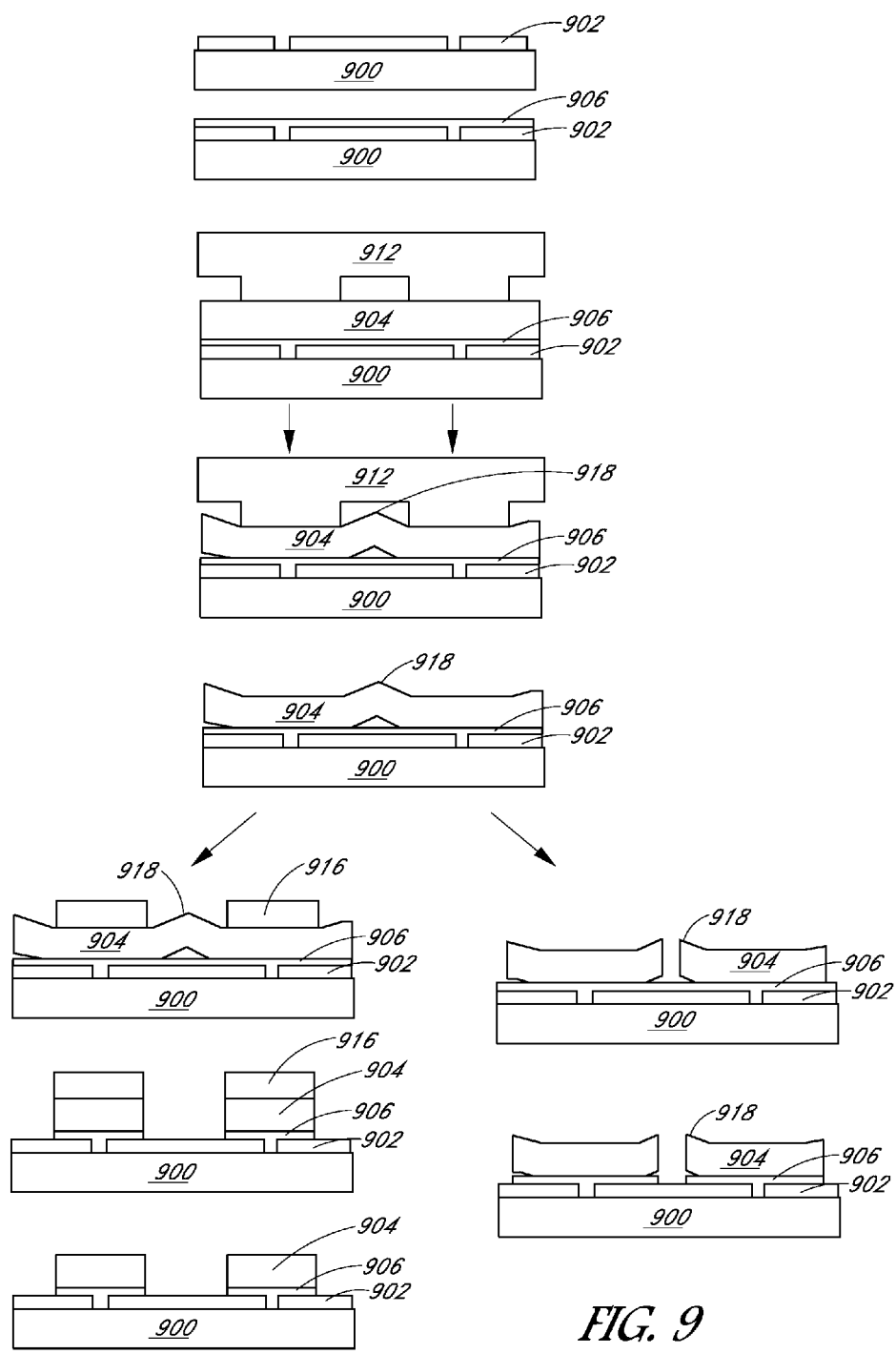
FIGS. 9 and 10 illustrate cross-sectional views of various example sequences for selectively applying pressure in forming a conductive contact.
Figure 10:
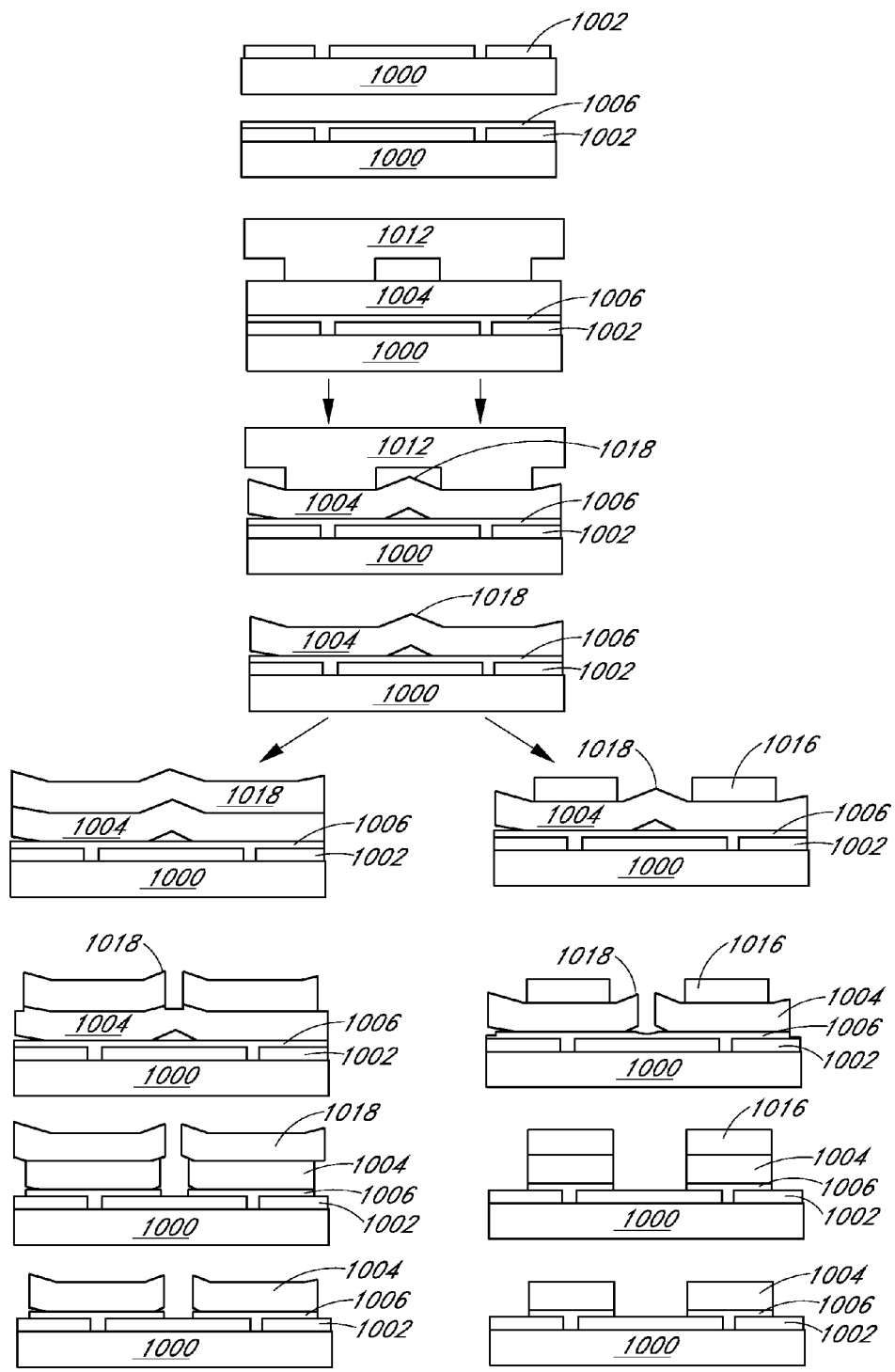
Figure 11A:
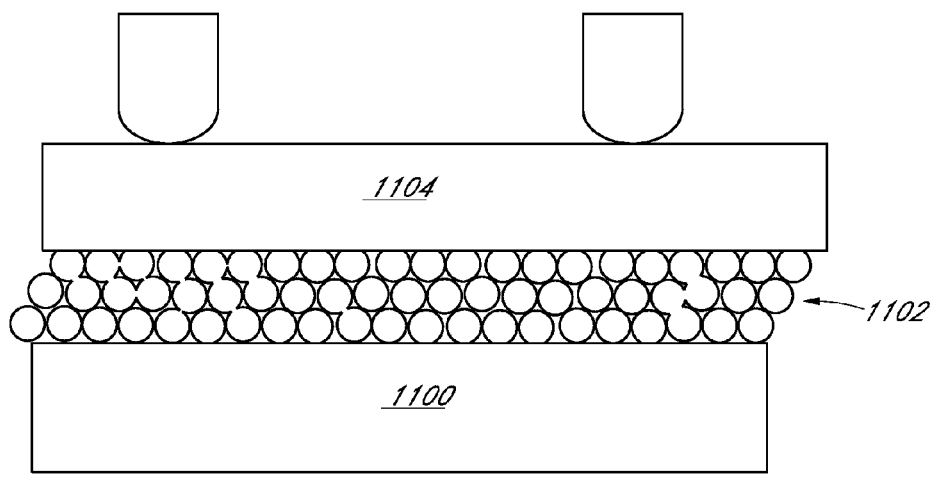
FIGS. 11A-11C illustrate cross-sectional views of an example sequence for selectively applying pressure in forming a conductive contact.
Figure 11B:
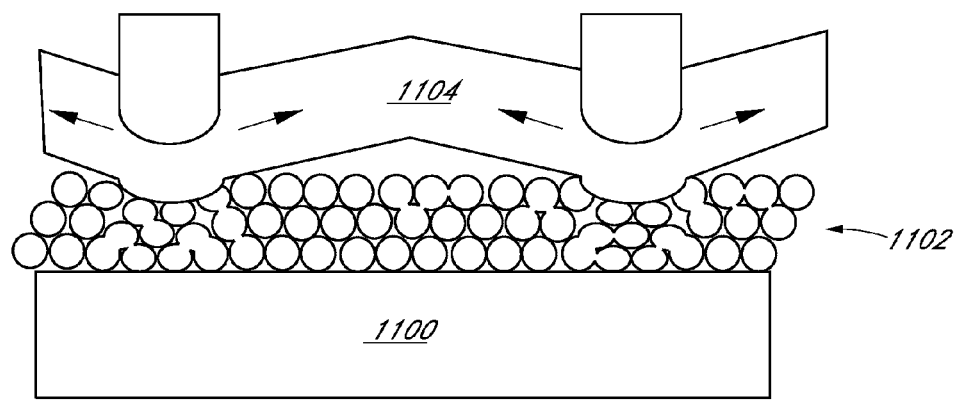
Figure 11C:
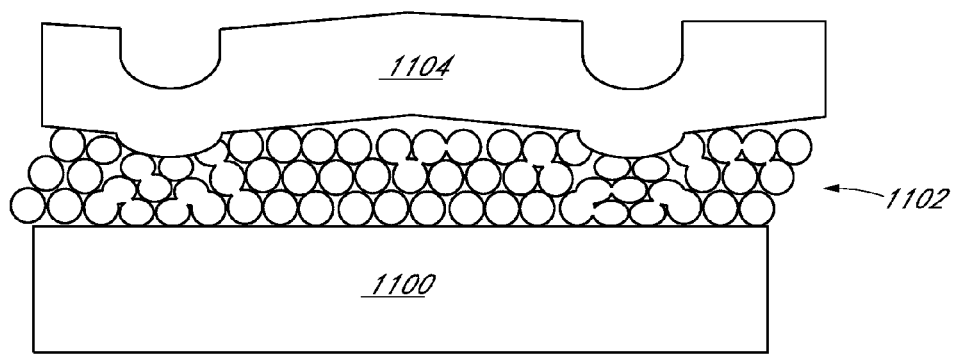

FIGS. 9 and 10 illustrate cross-sectional views of various example sequences for selectively applying pressure in forming a conductive contact. The examples of FIGS. 9 and 10 illustrate first metal region 906 but note that in other embodiments, it can be omitted. Selective pressure is applied, as shown by the downward arrows, by a patterned die 912/1012 or other tool to selectively apply pressure to bond select regions of the foil, conductive region(s), and semiconductor region. For example, the select regions can correspond to what ultimately are the conductive contacts or solar cell fingers. As illustrated, the selective pressure can result in one or more strain relief features 918/1018 that can help alleviate the tendency for the wafer to bow, as described herein. Note that the strain relief features 918/1018 may not be bonded to the first conductive region, as illustrated, or it can be weakly bonded as compared to the other regions.

Moreover, in embodiments in which the semiconductor regions are separated by a trench structure, applying selective pressure can reduce the risk that edges of the semiconductor regions break off and therefore reduce the risk that unwanted unpassivated portions of the semiconductor region exist (which could exist if enough of the edge breaks off).

Similar to the patterning techniques illustrated in FIG. 8, various example patterning techniques are illustrated in FIGS. 9 and 10. Various details described at FIG. 8 will not be repeated in the description of FIGS. 9 and 10. In one embodiment, the patterning technique shown on the left-hand side of FIG. 9 illustrates application of a patterned mask 916, followed by a chemical etch (which removes the portion of the foil and first metal region not covered by mask 916), and stripping of the mask 916.

The patterning technique shown on the right-hand side of FIG. 9 illustrates a groove and etch technique similar to the groove and etch technique of FIG. 8. As shown, the regions of foil between respective semiconductor areas are grooved (e.g., by laser ablation). Although shown as a complete groove of the regions of foil, in some embodiments, grooving can remove less than all of the thickness of the foil at the grooved location. Or, in some embodiments, all of the thickness of the foil at the grooved location can be removed and a portion of the first metal region can also be removed. The final view in the right-hand side of FIG. 9 illustrates the resulting solar cell after applying a chemical etch. When compared with mask and etch example of FIG. 8, the illustrated groove and etch example can result in wider fingers and can also result in at least a portion of the strain relief feature remaining in the cell. Note, however, that a wider groove area can be used in other examples such that the width of the fingers in a groove and etch example can be substantially similar to that of the mask and etch example.

FIG. 10 illustrates a similar main sequence as in FIG. 9 but with two different patterning techniques than in FIG. 9. The left-hand patterning technique of FIG. 10 illustrates a non-patterned mask technique, similar to the non-patterned mask technique of FIG. 8, whereas the right-hand patterning technique of FIG. 10 illustrates a mask, groove, and etch technique similar to that of FIG. 8.

In the various examples of FIGS. 8-10, the non-patterned mask, groove, and etch technique can enable the use of alternate choices of mask (e.g., a PET sheet, which cannot be printed) and can result in less etching of the finger top surface thereby leaving more metal intact on the fingers. Additionally, the mask, groove, and etch technique can permit less metal loading of the etch bath.

FIGS. 11A-11C illustrate cross-sectional views of an example sequence for selectively applying pressure in forming a conductive contact. The examples of FIG. 11A-11C illustrate applying selective pressure to conductive foil 1100 to achieve a finger pattern in which the metal of the conductive foil is substantially parallel to the corresponding metal in the first metal region 1102. Such a pattern is referred to herein as a fine M2 pattern.

Figure 12A:
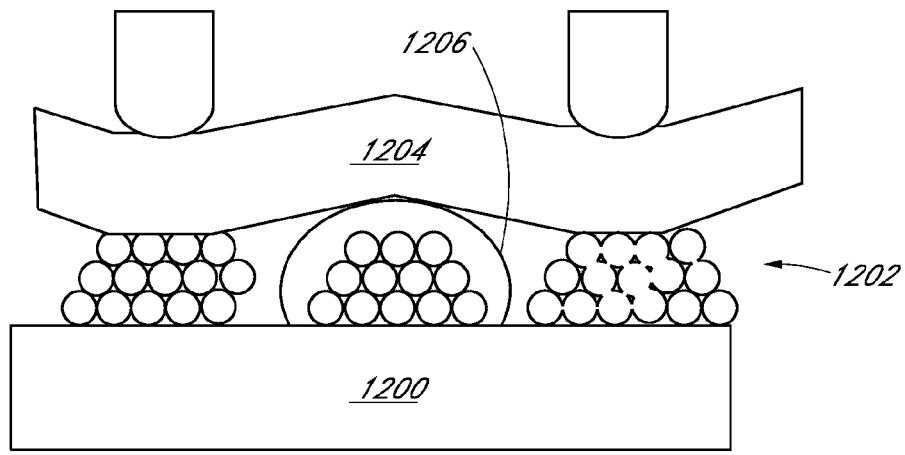
FIGS. 12A-12C illustrate cross-sectional views of another example sequence for selectively applying pressure in forming a conductive contact.
Figure 12B:
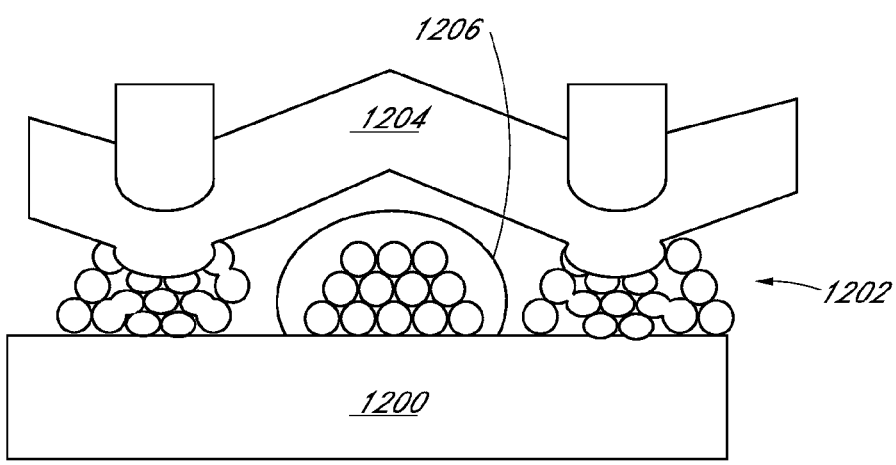
Figure 12C:
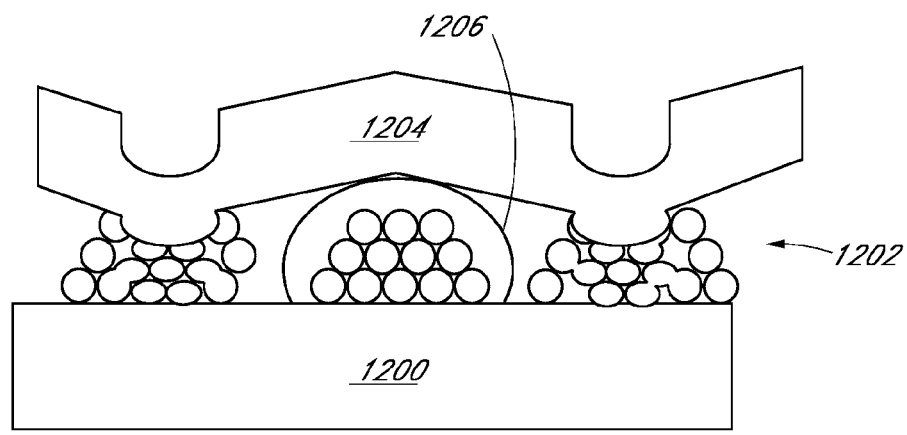

FIGS. 12A-12C illustrate cross-sectional views of another example sequence for selectively applying pressure in forming a conductive contact. The examples of FIGS. 12A-12C illustrate applying selective pressure to conductive foil 1200 to achieve a finger pattern in which the metal of the conductive foil is substantially perpendicular to the corresponding metal in the first metal region 1202. Such a pattern is referred to herein as a coarse M2 pattern. As shown, to achieve such a pattern, a high temperature dielectric 1206 can be formed over first conductive regions 1202 corresponding to an opposite metal type from which the foil finger 1200 is. For example, for regions in which the p-type fingers of the conductive foil overlap the n-type first metal regions, the dielectric 1206 can be applied to those n-type first metal regions. And for areas where n-type fingers of the conductive foil overlap p-type first metal regions, the dielectric 1206 can be applied to those p-type first metal regions.

Although FIGS. 11A-11C and 12A-12C illustrate the concepts of fine and coarse M2 patterns using selective pressure application, in other embodiments, substantially uniformly distributed pressure application can be used to achieve the illustrated coarse and fine M2 patterns.

FIGS. 13-16 illustrate cross-sectional views of various example sequences for forming a conductive contact in embodiments in which an additional metal portion is added to the conductive foil.

Figure 13:
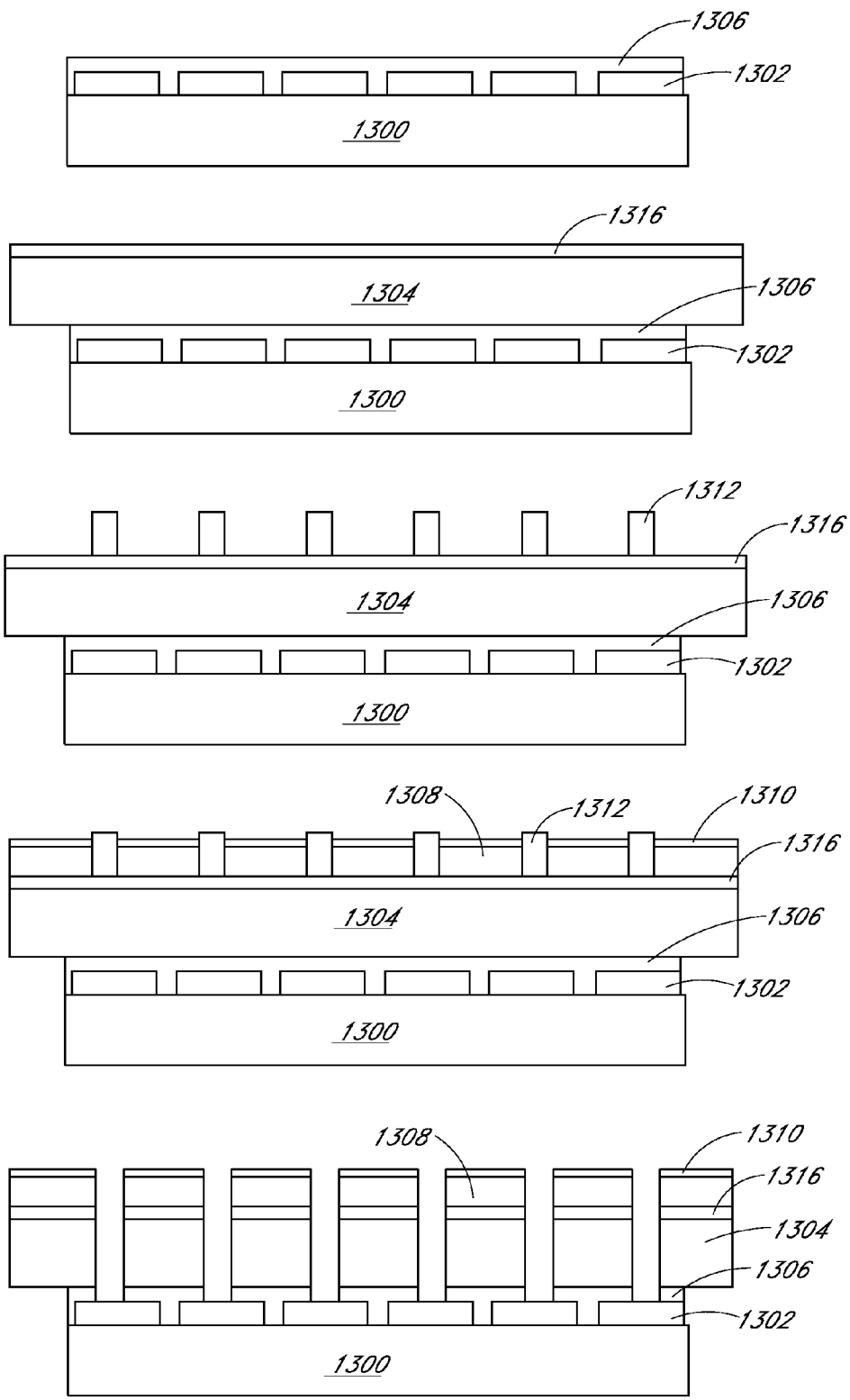
FIGS. 13-16 illustrate cross-sectional views of various example sequences for forming a conductive contact in embodiments in which an additional metal portion is added to the conductive foil.

FIG. 13 illustrates a conductive foil 1304 with an additional conductive layer 1316 on top. In various embodiments, the additional conductive layer 1316 can be a sputtered or evaporated layer, it can be a coating of the conductive foil, or it can be a separate foil that is thermally compressed during thermal compression of the foil or welded in some embodiments.

In one embodiment, the conductive foil 1304 is an aluminum foil with an additional conductive layer 1316 of copper. As shown, a plating mask 1312 can be applied in a particular pattern on the additional conductive layer 1316. Copper 1308 and/or tin 1310 can be plated to the additional conductive layer 1316. An etchback process can then be applied by removing the plating mask 1302 and etching the metal layers 1316, 1304, and 1306 in a suitable etchant or series of etchants resulting in the removal of the mask, and various metal layers resulting in the patterned solar cell in the final view of FIG. 13.

By using a copper surface as the additional conductive layer, plating with copper and/or soldering to cell-to-cell interconnects can be performed.

Figure 14:
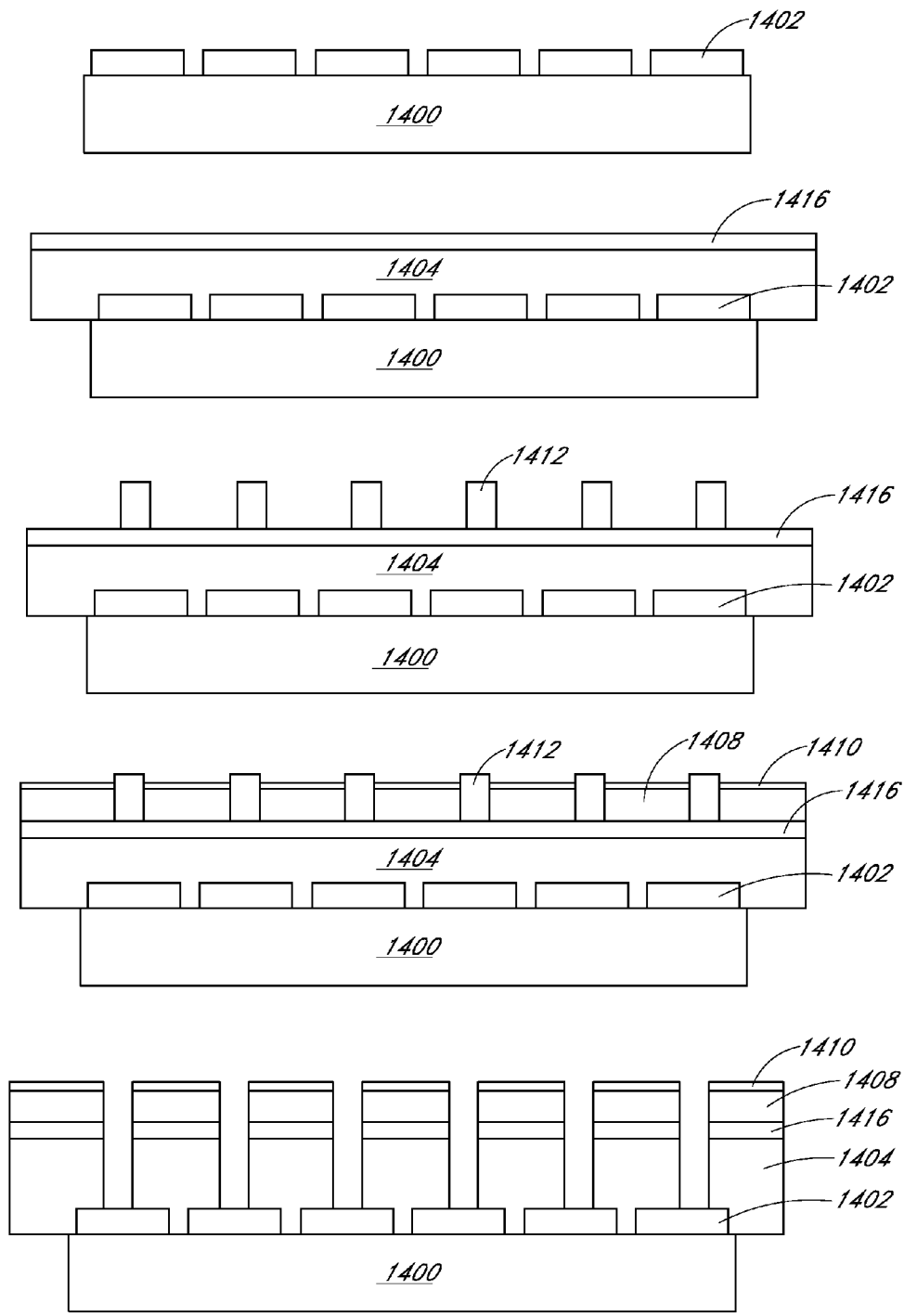

FIG. 14 illustrates a conductive foil 1404 with an additional conductive layer 1416 as in the example of FIG. 13. Different than FIG. 13, the example in FIG. 14 does not include an additional metal region (as in first metal region 1306 in FIG. 13). Instead, the conductive foil 1404 can make direct contact with the silicon between openings in dielectric regions 1402. The remaining views of FIG. 14 are similar to those of FIG. 13; therefore, the description applies equally to the views of FIG. 14.

Figure 15:
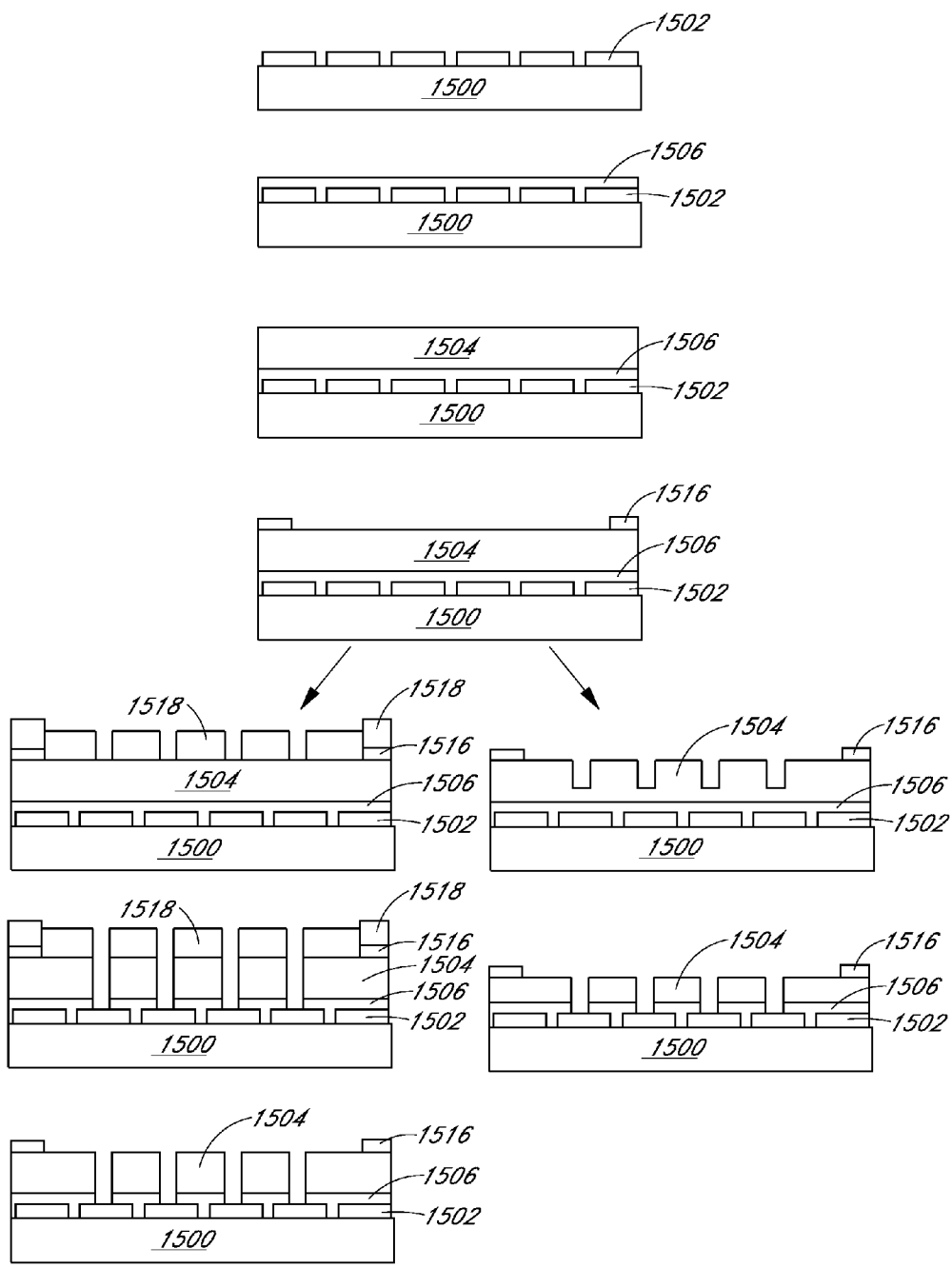

FIG. 15 illustrates a conductive foil 1504 with additional conductive regions 1516 as bond pads, such as solderable bond pads. Various examples of additional conductive regions include copper foil, nickel foil, among other solderable materials. As shown, additional conductive regions 1516 exist at the bond pads, as shown in FIG. 15. The bond pads can be thermocompressed to the conductive foil 1504, or it can be welded or otherwise bonded to conductive foil 1504. The patterning sequence illustrated in the left-hand side of FIG. 15 illustrates a mask and etch patterning technique whereas the right-hand side of FIG. 15 illustrates a groove and etch patterning technique, both of which are described herein.

Figure 16:
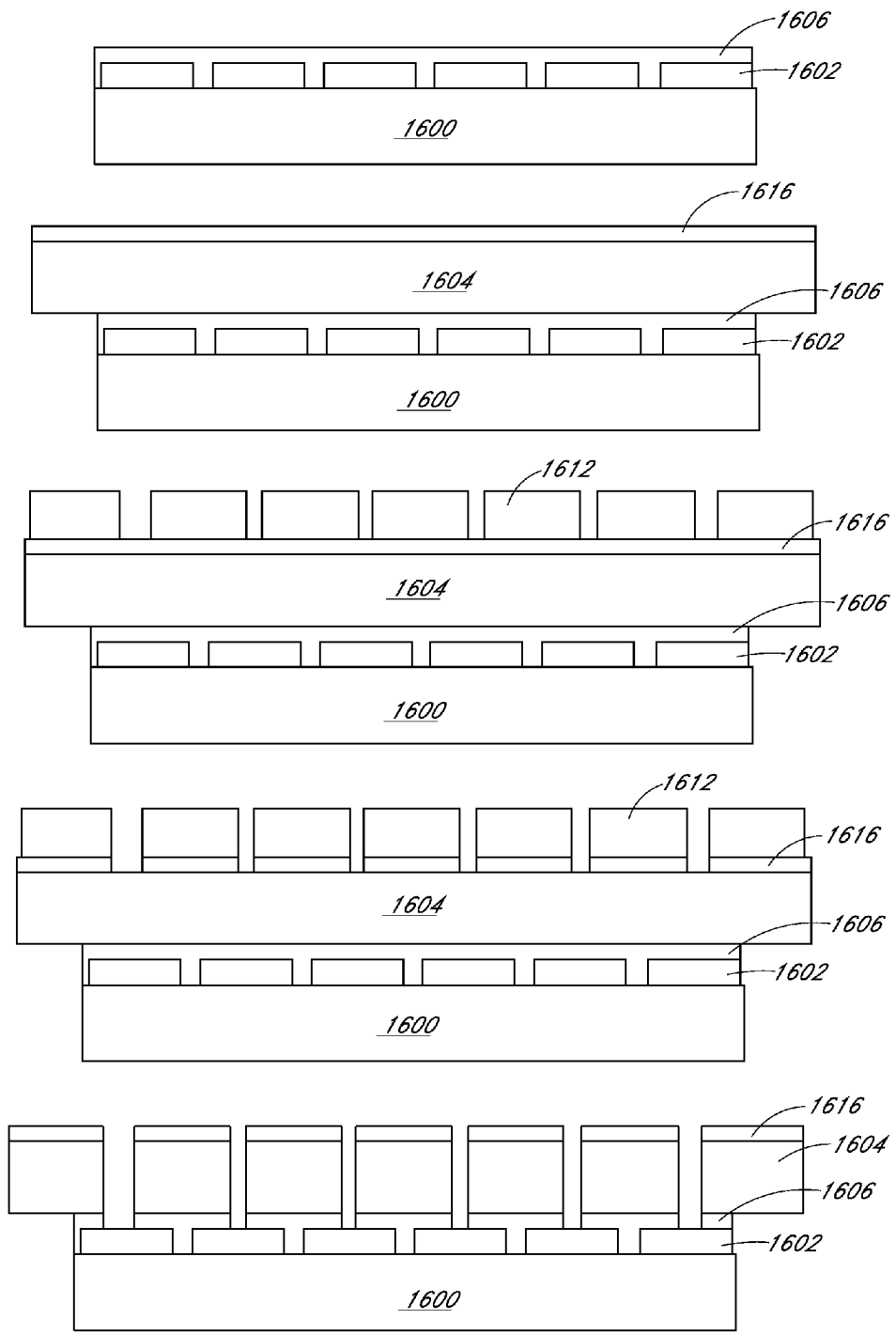

FIG. 16 illustrates a process in which a copper mask is applied to the copper coated foil. As shown, a copper etch mask 1602 can be applied to additional copper layer 1616, followed by an etching of portions of copper (e.g., by ferric chloride, peroxide/HCl, or other copper etchant, etc.) followed by an etching of portions of the remaining conductive foil, resulting in the structure in the final view of FIG. 16.

In one embodiment, the coating on the foil can be patterned (e.g., laser patterned) to form a copper etch mask, which can then be used as a hard etch resist mask for KOH etching of aluminum.

Figure 17A:
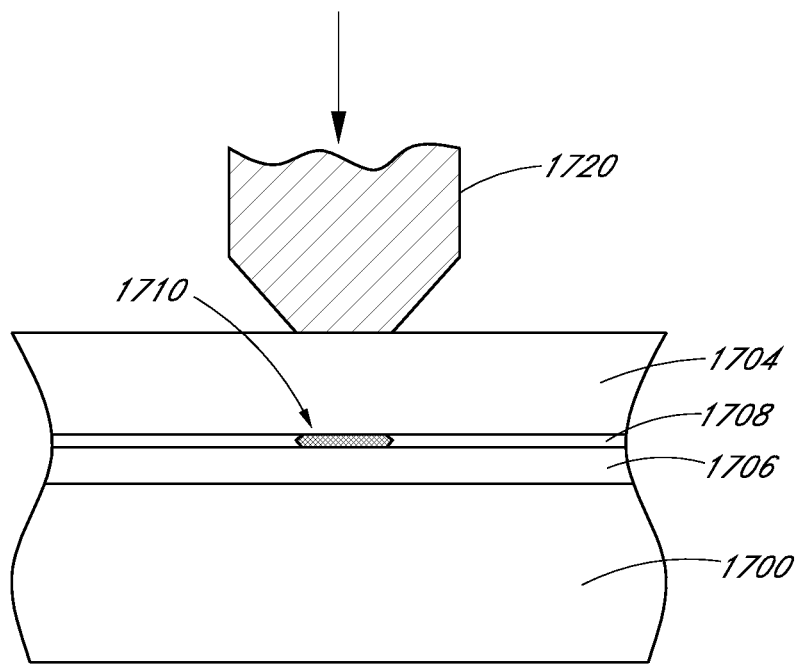
FIGS. 17A and 17B illustrate cross-sectional views of a solar cell structure having an intermetallic region.
Figure 17B:
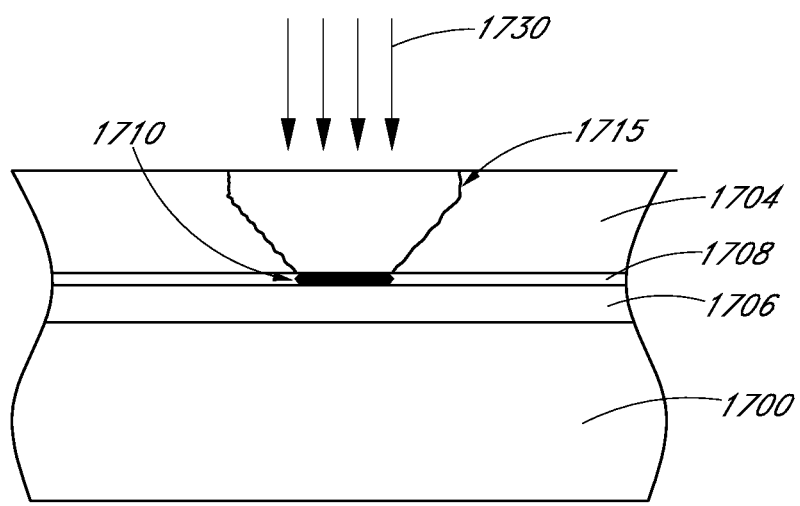

FIGS. 17A and 17B illustrate cross-section views of a solar cell structure having an intermetallic region. FIGS. 17A and 17B illustrate a solar cell structure similar to the structures of FIGS. 1A and 1B having first and second metal regions 1706 and 1708 and a conductive foil 1704. As shown, both structures have an intermetallic zone/phase/ region 1710, as described herein, which is formed from the second metal region 1706 and the conductive foil 1704. The difference between FIGS. 17A and 17B is that FIG. 17A illustrates thermally compressed conductive foil and first and second metal regions to form the intermetallic phase 1710 whereas FIG. 17B illustrates using heat (e.g., laser heat) to locally melt the metal to form the intermetallic phase 1710.

In one embodiment, the second metal region 1708 can be nickel, germanium, or silicon. In various embodiments, the thickness of the first metal region 1706 can be less than 5 microns (e.g., less than 1 micron), and the conductive foil 1704 can be between 10 and 100 microns (e.g., 30-60 microns).

In one embodiment, the thickness of the second metal region 1708 is chosen such that the bond strength of the resulting intermetallic joint is high and that the volume of the conductive foil converted into the intermetallic phase is limited so as not to reduce its mechanical strength or its electrical conductivity.

For the example of FIG. 17A, the intermetallic zone formation can be at least partially dependent on the thickness of the second conductive region. For the example of FIG. 17B, the volume that is affected by the intermetallic formation can be dependent on the thickness of the conductive foil and the lateral dimension of the melt zone 1715. Thus, in some embodiments, the thickness of the second conductive region and the lateral dimension of the melt zone 1715 can be used to define the ratio of concentration of the two metals in the intermetallic mixture to a value that is suited to produce a mechanically stable joint.

By using a second metal region that allows for the creation of an intermetallic zone, a lower temperature and/or less pressure can be used, thereby reducing the risk to damage to the solar cell.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A method of fabricating a solar cell, the method comprising:
   placing a conductive foil over a semiconductor region disposed in or above a substrate;
   heating the conductive foil;
   applying mechanical force to the heated conductive foil to form a conductive bond for the solar cell; and
   forming a strain relief feature.

2. The method of claim 1, wherein said heating the conductive foil and said applying mechanical force are performed by a same tool.

3. The method of claim 1, wherein said applying mechanical force is performed using a patterned die.

4. The method of claim 1, further comprising forming a solderable region on the conductive foil, wherein the solderable region includes a material other than that of the conductive foil.

5. The method of claim 1, wherein said heating the foil and said applying mechanical force are performed as part of a forming gas anneal process.

6. The method of claim 1, wherein said applying mechanical force is performed substantially uniformly across the conductive foil corresponding to the substrate.

7. The method of claim 1, further comprising after said applying mechanical force, laser welding the conductive bond.

8. The method of claim 1, further comprising grooving and etching regions of the foil to form contact fingers for the solar cell.

9. A method of fabricating a solar cell, the method comprising: forming a first metal region over a semiconductor region disposed in or above a substrate;
   forming a second metal region over the first metal region;
   placing a conductive foil over the first metal region;
   bonding the conductive foil to the second metal region and to the first metal region; and
   patterning the conductive foil and the second metal region and the first metal region; and
   applying an ultrasonic agitation technique to the conductive foil and first metal region.

10. The method of claim 9, wherein said bonding includes forming an intermetallic compound from the conductive foil and the second metal region.

11. A method of fabricating a solar cell, the method comprising:
    forming a first metal region over a semiconductor region disposed in or above a substrate:
    placing a conductive foil over the first metal region;
    bonding the conductive foil to the first metal region; and
    patterning the conductive foil and the first metal region; and
    applying an ultrasonic agitation technique to the conductive foil and first metal region, wherein said patterning the conductive foil includes:
    printing a mask over regions of the conductive foil; and
    applying a chemical etch.

12. A method of fabricating a solar cell, the method comprising:
    forming a first metal region over a semiconductor region disposed in or above a substrate;
    placing a conductive foil over the first metal region;
    bonding the conductive foil to the first metal region; and
    patterning the conductive foil and the first metal region; and
    applying an ultrasonic agitation technique to the conductive foil and first metal region, wherein said patterning the conductive foil includes:
    laser grooving regions of the conductive foil to remove a majority of a thickness of the regions; and
    applying a chemical etch.

13. A method of fabricating a solar cell, the method comprising: forming a first metal region over a semiconductor region disposed in or above a substrate;
    placing a conductive foil over the first metal region;
    bonding the conductive foil to the first metal region; and
    patterning the conductive foil and the first metal region; and applying an ultrasonic agitation technique to the conductive foil and first metal region, wherein said patterning the conductive foil includes:
- applying a non-patterned mask across the conductive foil;
- patterning the non-patterned mask; and
- applying a chemical etch.

14. A method of fabricating a solar cell, the method comprising:
- forming a first metal region over a semiconductor region disposed in or above a substrate;
- placing a conductive foil over the first metal region;
- bonding the conductive foil to the first metal region; and
- patterning the conductive foil and the first metal region; and
- applying an ultrasonic agitation technique to the conductive foil and first metal region, wherein said patterning the conductive foil includes:
  - laser patterning an etch resistant coating of the conductive foil; and
  - applying a chemical etch.

15. A method of fabricating a solar cell, the method comprising:
- placing a conductive foil over a semiconductor region disposed in or above a substrate;
- heating the conductive foil;
- applying mechanical force to the heated conductive foil to form a conductive bond for the solar cell, wherein said heating the foil and said applying mechanical force are performed as part of a forming gas anneal process.

16. The method of claim 15, wherein said heating the conductive foil and said applying mechanical force are performed by a same tool.

17. The method of claim 15, wherein said applying mechanical force is performed using a patterned die.

18. The method of claim 15, further comprising forming a solderable region on the conductive foil, wherein the solderable region includes a material other than that of the conductive foil.

19. The method of claim 15, wherein said applying mechanical force is performed substantially uniformly across the conductive foil corresponding to the substrate.

20. The method of claim 15, further comprising after said applying mechanical force, laser welding the conductive bond.

21. The method of claim 15, further comprising grooving and etching regions of the foil to form contact fingers for the solar cell.

22. A method of fabricating a solar cell, the method comprising:
- placing a conductive foil over a semiconductor region disposed in or above a substrate;
- heating the conductive foil;
- applying mechanical force to the heated conductive foil to form a conductive bond for the solar cell; and
- after said applying mechanical force, laser welding the conductive bond.

23. The method of claim 22, wherein said heating the conductive foil and said applying mechanical force are performed by a same tool.

24. The method of claim 22, wherein said applying mechanical force is performed using a patterned die.

25. The method of claim 22, further comprising forming a solderable region on the conductive foil, wherein the solderable region includes a material other than that of the conductive foil.

26. The method of claim 22, wherein said applying mechanical force is performed substantially uniformly across the conductive foil corresponding to the substrate.

27. The method of claim 22, further comprising grooving and etching regions of the foil to form contact fingers for the solar cell.

28. A method of fabricating a solar cell, the method comprising:
- forming a first metal region over a semiconductor region disposed in or above a substrate;
- placing a conductive foil over the first metal region;
- bonding the conductive foil to the first metal region; and
- patterning the conductive foil and the first metal region wherein said patterning the conductive foil includes:
  - laser patterning an etch resistant coating of the conductive foil; and
  - applying a chemical etch.

29. The method of claim 28, further comprising forming a second metal region over the first metal region, wherein said bonding includes bonding the conductive foil to the first and second metal, and wherein said patterning includes patterning the conductive foil and the first and second metal regions.

30. The method of claim 29, wherein said bonding includes forming an intermetallic compound from the conductive foil and the second metal region.

* * * * *

UNITED STATES PATENT AND TRADEMARK OFFICE
CERTIFICATE OF CORRECTION

Page 1 of 1

PATENT NO. : 9,818,903 B2
APPLICATION NO. : 14/266043
DATED : November 14, 2017
INVENTOR(S) : Sewell et al.

It is certified that error appears in the above-identified patent and that said Letters Patent is hereby corrected as shown below:

In the Specification

Please insert the following government support clause directly below the title at Column 1, before the Background:
-- STATEMENT REGARDING FEDERALLY SPONSORED RESEARCH OR DEVELOPMENT
This invention was made with government support under DE-EE0008175 awarded by The U.S. Department of Energy. The government has certain rights in the invention. --

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*